US009385322B2

(12) United States Patent
Bulovic et al.

(10) Patent No.: US 9,385,322 B2
(45) Date of Patent: Jul. 5, 2016

(54) METHOD AND APPARATUS FOR DEPOSITING LED ORGANIC FILM (75) Inventors: Vladimir Bulovic, Lexington, MA (US); Marc A. Baldo, Cambridge, MA (US); Martin A. Schmidt, Reading, MA (US); Valerie Gassend, San Carlos, CA (US); Jianglong Chen, San Jose, CA (US)

(73) Assignee: Massachusetts Institute of Technology, Cambridge, CA (US)

( * ) Notice: Subject to any disclaimer, the term of this patent is extended or adjusted under 35 U.S.C. 154(b) by 609 days.

(21) Appl. No.: 13/095,619

(22) Filed: Apr. 27, 2011

(65) Prior Publication Data
US 2011/0262624 A1 Oct. 27, 2011

Related U.S. Application Data (60) Division of application No. 11/282,472, filed on Nov. 21, 2005, now Pat. No. 8,128,753, and a continuation of application No. 13/050,907, filed on Mar. 17, 2011, now abandoned, and a continuation of application No. 13/088,323, filed on Apr. 15, 2011, now Pat. No. 8,986,780.

(51) Int. Cl.
*C23C 16/00* (2006.01)
*H01L 51/00* (2006.01)
(Continued)

(52) U.S. Cl.
CPC ............ *H01L 51/0011* (2013.01); *C23C 16/04* (2013.01); *C23C 16/042* (2013.01); *C23C 16/448* (2013.01); *C23C 16/4481* (2013.01); *C23C 16/4483* (2013.01); *C23C 16/4485* (2013.01); *C23C 16/45568* (2013.01);
(Continued)

(58) Field of Classification Search
CPC ............... C23C 16/4481; C23C 16/45568; C23C 16/45585; C23C 16/04; C23C 16/4483; C23C 16/45565; C23C 16/448
USPC ............................................. 427/255.6, 248.1
See application file for complete search history.

(56) References Cited

U.S. PATENT DOCUMENTS

| | | | |
|---|---|---|---|
| 4,238,807 A | 12/1980 | Bovio et al. | |
| 4,751,531 A | 6/1988 | Saito et al. | |
| 5,041,161 A | 8/1991 | Cooke et al. | |
| 5,116,148 A | 5/1992 | Ohara et al. | |
| 5,155,502 A | 10/1992 | Kimura et al. | |

(Continued)

FOREIGN PATENT DOCUMENTS

| | | |
|---|---|---|
| EP | 1 626 103 | 2/2006 |
| JP | 06-122201 | 5/1994 |

(Continued)

OTHER PUBLICATIONS

Street et al., "Jet Printing of Active-Matrix TFT Backplanes for Displays and Sensors", IS&T Archiving, Dec. 2005, vol. 20, No. 5, 16 pages.

(Continued)

*Primary Examiner* — Kelly M Gambetta (57) ABSTRACT

In one embodiment the disclosure relates to an apparatus for depositing an organic material on a substrate, including a source heater for heating organic particles to form suspended organic particles; a transport stream for delivering the suspended organic particles to a discharge nozzle, the discharge nozzle having a plurality of micro-pores, the micro-pores providing a conduit for passage of the suspended organic particles; and a nozzle heater for pulsatingly heating the micro-pores nozzle to discharge the suspended organic particles from the discharge nozzle.

13 Claims, 5 Drawing Sheets (51) Int. Cl.

| | |
|---|---|
| *C23C 16/448* | (2006.01) |
| *C23C 16/455* | (2006.01) |
| *C23C 16/04* | (2006.01) |
| *B05D 1/12* | (2006.01) |
| *H01L 51/56* | (2006.01) |

(52) U.S. Cl.
CPC ............. *B05D1/12* (2013.01); *C23C 16/45565* (2013.01); *H01L 51/56* (2013.01)

(56) References Cited

U.S. PATENT DOCUMENTS

| | | | |
|---|---|---|---|
| 5,172,139 A | 12/1992 | Sekiya et al. | |
| 5,202,659 A | 4/1993 | DeBonte et al. | |
| 5,247,190 A | 9/1993 | Friend et al. | |
| 5,405,710 A | 4/1995 | Dodabalapur et al. | |
| 5,574,485 A | 11/1996 | Anderson et al. | |
| 5,623,292 A | 4/1997 | Shrivastava et al. | |
| 5,703,436 A | 12/1997 | Forrest et al. | |
| 5,707,745 A | 1/1998 | Forrest et al. | |
| 5,731,828 A | 3/1998 | Ishinaga et al. | |
| 5,781,210 A | 7/1998 | Hirano et al. | |
| 5,801,721 A | 9/1998 | Gandy et al. | |
| 5,834,893 A | 11/1998 | Bulovic et al. | |
| 5,844,363 A | 12/1998 | Gu et al. | |
| 5,865,860 A | 2/1999 | Delnick | |
| 5,947,022 A | 9/1999 | Freeman et al. | |
| 5,956,051 A | 9/1999 | Davies et al. | |
| 6,013,982 A | 1/2000 | Thompson et al. | |
| 6,065,825 A | 5/2000 | Anagnostopoulos et al. | |
| 6,086,195 A | 7/2000 | Bohorquez et al. | |
| 6,086,196 A | 7/2000 | Ando et al. | |
| 6,086,679 A | 7/2000 | Lee et al. | |
| 6,087,196 A | 7/2000 | Sturm et al. | |
| 6,091,195 A | 7/2000 | Forrest et al. | |
| 6,095,630 A | 8/2000 | Horii et al. | |
| 6,097,147 A | 8/2000 | Baldo et al. | |
| 6,189,989 B1 | 2/2001 | Hirabayashi et al. | |
| 6,250,747 B1 | 6/2001 | Hauck | |
| 6,257,706 B1 | 7/2001 | Ahn | |
| 6,294,398 B1 | 9/2001 | Kim et al. | |
| 6,303,238 B1 | 10/2001 | Thompson et al. | |
| 6,312,083 B1 | 11/2001 | Moore | |
| 6,326,224 B1 | 12/2001 | Xu et al. | |
| 6,337,102 B1 | 1/2002 | Forrest et al. | |
| 6,431,702 B2 | 8/2002 | Ruhe | |
| 6,444,400 B1 | 9/2002 | Cloots et al. | |
| 6,453,810 B1 | 9/2002 | Rossmeisl et al. | |
| 6,460,972 B1 | 10/2002 | Trauernicht et al. | |
| 6,468,819 B1 | 10/2002 | Kim et al. | |
| 6,472,962 B1 | 10/2002 | Guo et al. | |
| 6,498,802 B1 | 12/2002 | Chu et al. | |
| 6,513,903 B2 | 2/2003 | Sharma et al. | |
| 6,548,956 B2 | 4/2003 | Forrest et al. | |
| 6,562,405 B2 | 5/2003 | Eser et al. | |
| 6,576,134 B1 | 6/2003 | Agner | |
| 6,586,763 B2 | 7/2003 | Wang et al. | |
| 6,601,936 B2 | 8/2003 | McDonald | |
| 6,666,548 B1 | 12/2003 | Sadasivan et al. | |
| 6,811,896 B2 | 11/2004 | Aziz et al. | |
| 6,824,262 B2 | 11/2004 | Kubota et al. | |
| 6,861,800 B2 | 3/2005 | Tyan et al. | |
| 6,896,346 B2 | 5/2005 | Trauernicht et al. | |
| 6,911,671 B2 | 6/2005 | Marcus et al. | |
| 6,917,159 B2 | 7/2005 | Tyan et al. | |
| 6,982,005 B2 | 1/2006 | Eser et al. | |
| 7,023,013 B2 | 4/2006 | Ricks et al. | |
| 7,077,513 B2 | 7/2006 | Kimura et al. | |
| 7,247,394 B2 | 7/2007 | Hatwar et al. | |
| 7,374,984 B2 | 5/2008 | Hoffman | |
| 7,377,616 B2 | 5/2008 | Sakurai | |
| 7,404,862 B2 | 7/2008 | Shtein et al. | |
| 7,406,761 B2 | 8/2008 | Jafri et al. | |
| 7,410,240 B2 | 8/2008 | Kadomatsu et al. | |
| 7,431,435 B2 | 10/2008 | Lopez et al. | |
| 7,431,968 B1 | 10/2008 | Shtein et al. | |
| 7,530,778 B2 | 5/2009 | Yassour et al. | |
| 7,604,439 B2 | 10/2009 | Yassour et al. | |
| 7,648,230 B2 | 1/2010 | Kachi | |
| 7,677,690 B2 | 3/2010 | Takatsuka | |
| 7,802,537 B2 | 9/2010 | Kang et al. | |
| 7,857,121 B2 | 12/2010 | Yassour | |
| 7,883,832 B2 | 2/2011 | Colburn et al. | |
| 7,908,885 B2 | 3/2011 | Devitt | |
| 8,128,753 B2 | 3/2012 | Bulovic et al. | |
| 2001/0045973 A1 | 11/2001 | Sharma et al. | |
| 2002/0008732 A1 | 1/2002 | Moon et al. | |
| 2002/0191063 A1 | 12/2002 | Gelbart et al. | |
| 2003/0000476 A1 | 1/2003 | Matsunaga et al. | |
| 2003/0175414 A1 | 9/2003 | Hayashi | |
| 2003/0230980 A1 | 12/2003 | Forrest et al. | |
| 2004/0009304 A1 | 1/2004 | Pichler | |
| 2004/0048000 A1 | 3/2004 | Shtein et al. | |
| 2004/0048183 A1 | 3/2004 | Teshima | |
| 2004/0056244 A1 | 3/2004 | Marcus et al. | |
| 2004/0086631 A1 | 5/2004 | Han | |
| 2004/0174116 A1 | 9/2004 | Lu et al. | |
| 2004/0202794 A1 | 10/2004 | Yoshida | |
| 2005/0005850 A1 | 1/2005 | Yamazaki et al. | |
| 2005/0087131 A1* | 4/2005 | Shtein et al. ................. 118/715 |
| 2005/0100690 A1* | 5/2005 | Mayer et al. ..................... 428/34 |
| 2005/0190220 A1 | 9/2005 | Lim et al. | |
| 2005/0223994 A1 | 10/2005 | Blomlelly et al. | |
| 2005/0255249 A1 | 11/2005 | Schlatterbeck | |
| 2006/0012290 A1 | 1/2006 | Kang | |
| 2006/0115585 A1 | 6/2006 | Bulovic et al. | |
| 2007/0040877 A1 | 2/2007 | Kachi | |
| 2007/0058010 A1 | 3/2007 | Nagashima | |
| 2007/0098891 A1 | 5/2007 | Tyan et al. | |
| 2007/0134512 A1 | 6/2007 | Klubek et al. | |
| 2007/0286944 A1 | 12/2007 | Yokoyama et al. | |
| 2008/0174235 A1 | 7/2008 | Kim et al. | |
| 2008/0238310 A1 | 10/2008 | Forrest et al. | |
| 2008/0299311 A1 | 12/2008 | Shtein et al. | |
| 2008/0308037 A1 | 12/2008 | Bulovic et al. | |
| 2008/0311289 A1 | 12/2008 | Bulovic et al. | |
| 2008/0311296 A1 | 12/2008 | Shtein et al. | |
| 2008/0311307 A1 | 12/2008 | Bulovic et al. | |
| 2009/0031579 A1 | 2/2009 | Piatt et al. | |
| 2009/0045739 A1 | 2/2009 | Kho et al. | |
| 2009/0115706 A1 | 5/2009 | Hwang et al. | |
| 2009/0167162 A1 | 7/2009 | Lin et al. | |
| 2009/0220680 A1 | 9/2009 | Winters | |
| 2010/0055810 A1 | 3/2010 | Sung et al. | |
| 2010/0079513 A1 | 4/2010 | Taira et al. | |
| 2010/0171780 A1 | 7/2010 | Madigan et al. | |
| 2010/0188457 A1 | 7/2010 | Madigan et al. | |
| 2010/0201749 A1 | 8/2010 | Somekh et al. | |
| 2010/0310424 A1 | 12/2010 | Rose et al. | |
| 2011/0008541 A1 | 1/2011 | Madigan et al. | |
| 2011/0057171 A1 | 3/2011 | Adamovich et al. | |
| 2011/0181644 A1 | 7/2011 | Bulovic et al. | |
| 2011/0267390 A1 | 11/2011 | Bulovic et al. | |
| 2011/0293818 A1 | 12/2011 | Madigan et al. | |

FOREIGN PATENT DOCUMENTS

| | | |
|---|---|---|
| JP | 08-216401 | 8/1996 |
| JP | 09-248918 | 9/1997 |
| JP | 2002-069650 | 3/2002 |
| JP | 2005-286069 | 10/2005 |
| JP | 2006-123551 | 5/2006 |
| JP | 2006-150900 | 6/2006 |
| JP | 2007-076168 | 3/2007 |
| JP | 2007-095343 | 4/2007 |
| JP | 2007-299616 | 11/2007 |
| JP | 05-255630 | 10/2009 |
| KR | 100232852 | 12/1999 |

(56) References Cited

FOREIGN PATENT DOCUMENTS

| KR | 10-2008-0060111 | 7/2007 |
|---|---|---|
| WO | WO 2005/090085 | 9/2005 |

OTHER PUBLICATIONS

Chin, Byung Doo, "Effective Hole Transport Layer Structure for Top Emitting Devices Based on Laser Transfer Patterning," Journal of Physics D: Applied Physics, 2007, vol. 40, pp. 5541-5546.

Elwenspoek et al., "Silicon Micromachining," Aug. 2004, Cambridge University, Cambridge, U.K. ISBN 0521607671. [Abstract].

Forrest, Stephen R., "The Path to Ubiquitous and Low-cost Organic Electronic Appliances on Plastic," Nature, Apr. 29, 2004, vol. 428, 8 pages.

C. Ducso, et al. "Porous Silicon Bulk Micromachining for Thermally Isolated Membrane Formation," Sensors and Actuators A, 1997, vol. 60, pp. 235-239.

C. Tsamis, et al. "Thermal Properties of Suspended Porous Micro-hotplates for Sensor Applications," Sensor and Actuators B, 2003, vol. 95, pp. 78-82.

J. Lee, et al. "Differential Scanning Calorimeter Based on Suspended Membrane Single Crystal Silicon Microhotplate," Journal of Microelectromechanical Systems, Dec. 2008, vol. 17, No. 6, pp. 1513-1525.

J. C. Belmonte, et al. "High-temperature Low-power Performing Micromachined Suspended Micro-hotplate for Gas Sensing Applications<" Sensors and Actuators B, 2006, vol. 114, pp. 826-835.

G.S. Chung, "Fabrication and Characterization of Micro-heaters with Low-power Consumption using SOI membrane and Trench Structures," Sensors and Actuators A, 2004, vol. 112, pp. 55-60.

Geffroy et al., "Organic Light-emitting Diode (OLED) Technology: Material Devices and Display Technologies," *Polymer International*, Jun. 2006, vol. 55, pp. 572-582. (Abstract only).

Huang et al., "Reducing Blueshift of Viewing Angle for Top-Eimtting Organic Light-Emitting Devices," Dec. 6, 2008, 3 pages.

J. Lee, et al. "Cavity Effects on Light Extraction in Organic Light emitting Devices," Applied Physics Letters, Jan. 24, 2008, vol. 92, No. 3, 5 pages.

Leblanc et al., "Micromachined Printheads for the Evaporative Patterning of Organic Materials and Metals," Journal of Microelectromechanical Systems, Apr. 2007, vol. 16, No. 2, 7 pp. 1-139.

Lindermann et al., "Thermal Bubble Jet Printhead with Integrated Nozzle Plate," NIP20: International Conference on Digital Printing Technologies, Oct. 2004, pp. 834-839.

S.H. Kim et al. "Fabrication and Characterization of co-planar type MEMS Structures on SiO2/sI3n4 Membrane for Gas Sensrors with Dispensing Method Guided by Micromachined Wells," Journal of Electroceramicx, 2006, vol. 17, No. 2-4, pp. 995-998.

Chen, Jianglong, "Novel Patterning Techniques for Manufacturing Organic and Nanostructured Electronics," M.S. Materials Science and Engineering, Massachusetts Institute of Technology, 2003, pp. 1-206.

Chen, Jingkuang et al., "A High-Resolution Silicon Monolithic Nozzle Array for Inkjet Printing," IEEE Transactions on Electron Devices, vol. 44, No. 9, Sep. 1997, pp. 1401-1409.

Chen et al., "Evaporative Deposition of Molecular Organics in Ambient with a Molecular Jet Printer," Digital Fabrication, Sep. 2006, pp. 63-65 (Abstract only).

Chen et al., "Ambient Environment Patterning of Organic Thin Films by a Second Generation Molecular Jet (MoJet) Printer," Progress Report 2006-2007, Oct. 2007, pp. 26-6; 26-7.

International Search Report issued on Dec. 15, 2010 for PCT Application No. PCT/US10/020144.

International Search Report issued on Sep. 2, 2010 for PCT Application No. PCT/US10/033315.

International Search Report and Written Opinion issued on Mar. 24, 2011 for PCT Application No. PCT/US10/058145.

International Preliminary Report on Patentability issued on Dec. 17, 2009 for PCT Application No. PCT/US08/66975.

International Preliminary Report on Patentability issued on Dec. 7, 2009 for PCT Application No. PCT/US08/066991.

International Preliminary Report on Patentability issued on Dec. 17, 2009 for PCT Application No. PCT/US08/67002.

\* cited by examiner

(a) cross-section and (b) top view

Fig. 7A

Fig. 7B ed organic thin film is disclosed herein. Referring now to the drawings wherein like reference numerals are used to identify identical components in the various views,

METHOD AND APPARATUS FOR DEPOSITING LED ORGANIC FILM

This instant application is a continuation of both U.S. Non-Provisional application Ser. No. 11/282,472 filed Nov. 21, 2005; U.S. Non-Provisional application Ser. No. 13/050,907 filed Mar. 17, 2011; U.S. Non-Provisional application Ser. No. 13/088,323 and claims the filing-date priority to U.S. Provisional Application No. 60/629,312, filed Nov. 19, 2004.

BACKGROUND

The disclosure relates to a method and apparatus for depositing an organic film on a substrate. Manufacturing light emitting diode (LED) cell requires depositing of two thin organic films on a substrate and coupling each of the thin films to an electrode. Conventionally, the deposition step is carried out by evaporating the desired organic film on the substrate. The film thickness is a prime consideration. The layer thickness is about 100 nm and each layer is optimally deposited to an accuracy of about .+-.0.10 nm. As a result, conventional apparatus form multiple layers on a substrate with each layer having a thickness of about 10 nm. A combination of these layers will form the overall film. Because the organic constituents of the LED are often suspended in a solvent, removing the solvent prior to depositing each layer is crucial. A small amount of solvent in one layer of deposited organic thin film can cause contamination and destruction of the adjacent layers. Conventional techniques have failed to address this deficiency.

Another consideration in depositing organic thin films of an LED device is placing the films precisely at the desired location. Conventional technologies use shadow masking to form LED films of desired configuration. The shadow masking techniques require placing a well-defined mask over a region of the substrate followed by depositing the film over the entire substrate. Once deposition is complete, the shadow mask is removed to expose the protected portions of the substrate. Since every deposition step starts by forming a shadow mask and ends with removing and discarding the mask, a drawback of shadow masking technique is inefficiency.

SUMMARY OF THE DISCLOSURE

In one embodiment the disclosure relates to an apparatus for depositing an organic material on a substrate, the apparatus comprising: a source heater for heating organic particles to form suspended organic particles; a transport stream for delivering the suspended organic particles to a discharge nozzle, the discharge nozzle having a plurality of micro-pores, the micro-pores providing a conduit for passage of the suspended organic particles; and a nozzle heater for pulsatingly heating the nozzle to discharge the suspended organic particles from the discharge nozzle.

According to another embodiment, the disclosure relates to a method for depositing a layer of substantially solvent-free organic material on a substrate, comprising heating the organic material to form a plurality of suspended organic particles; delivering the suspended organic particles to a discharge nozzle, the discharge nozzle having a plurality of micro-pores for receiving the suspended organic particles; and energizing the discharge nozzle to pulsatingly eject the suspended organic particles from the discharge nozzle. Organic particle may include an organic molecule or a molecular aggregate.

According to another embodiment, the disclosure relates to a method for depositing a layer of organic material on a substrate. The organic material may be suspended in solvent to provide crystal growth or to convert an amorphous organic structure into a crystalline structure. The method can include heating the organic material to form a plurality of suspended organic particles; delivering the suspended organic particles to a discharge nozzle, the discharge nozzle having a plurality of micro-pores for receiving the suspended organic particles; and energizing the discharge nozzle to pulsatingly eject the suspended organic particles from the discharge nozzle. Organic particle may include an organic molecule or a molecular aggregate.

According to still another embodiment, the disclosure relates to an apparatus for depositing an organic compound on a substrate comprising a chamber having a reservoir for receiving the organic compound, the chamber having an inlet and an outlet for receiving a transport gas; a discharge nozzle having a plurality of micro-porous conduits for receiving the organic compound delivered by the transport gas; and an energy source coupled to the discharge nozzle to provide pulsating energy adapted to discharge at least a portion of the organic compound from one of the micro-porous conduits to a substrate.

In yet another embodiment, an apparatus for depositing an organic compound comprises a chamber having a reservoir for housing the organic material dissolved in a solvent, the reservoir separated from the chamber through an orifice; a discharge nozzle defined by a plurality of micro-porous conduits for receiving the organic compound communicated from the reservoir; and an energy source coupled to the discharge nozzle providing pulsating energy for discharging at least a portion of the organic compound from one of the micro-porous conduits to a substrate; and a delivery path connecting the chamber and the nozzle. The organic compound may be substantially free of solvent. Alternatively, the organic compound may include in solvent. In a solvent-based system, the solvent discharge from the nozzle provides the added benefit of cooling the nozzle upon discharge.

In still another embodiment, a micro-porous nozzle for depositing an organic composition on a substrate includes a thermal source communicating energy to organic material interposed between the heater and a porous medium, the porous medium having an integrated mask formed thereon to define a deposition pattern.

DETAILED DESCRIPTION

In one embodiment, the disclosure relates to a method and apparatus for depositing a pure organic thin film, or a mixed organic film, or an organic thin film mixed with inorganic particles, or inorganic thin film on a substrate. Such films can be used, among others, in the design and construction of organic LED.

Figure 1:
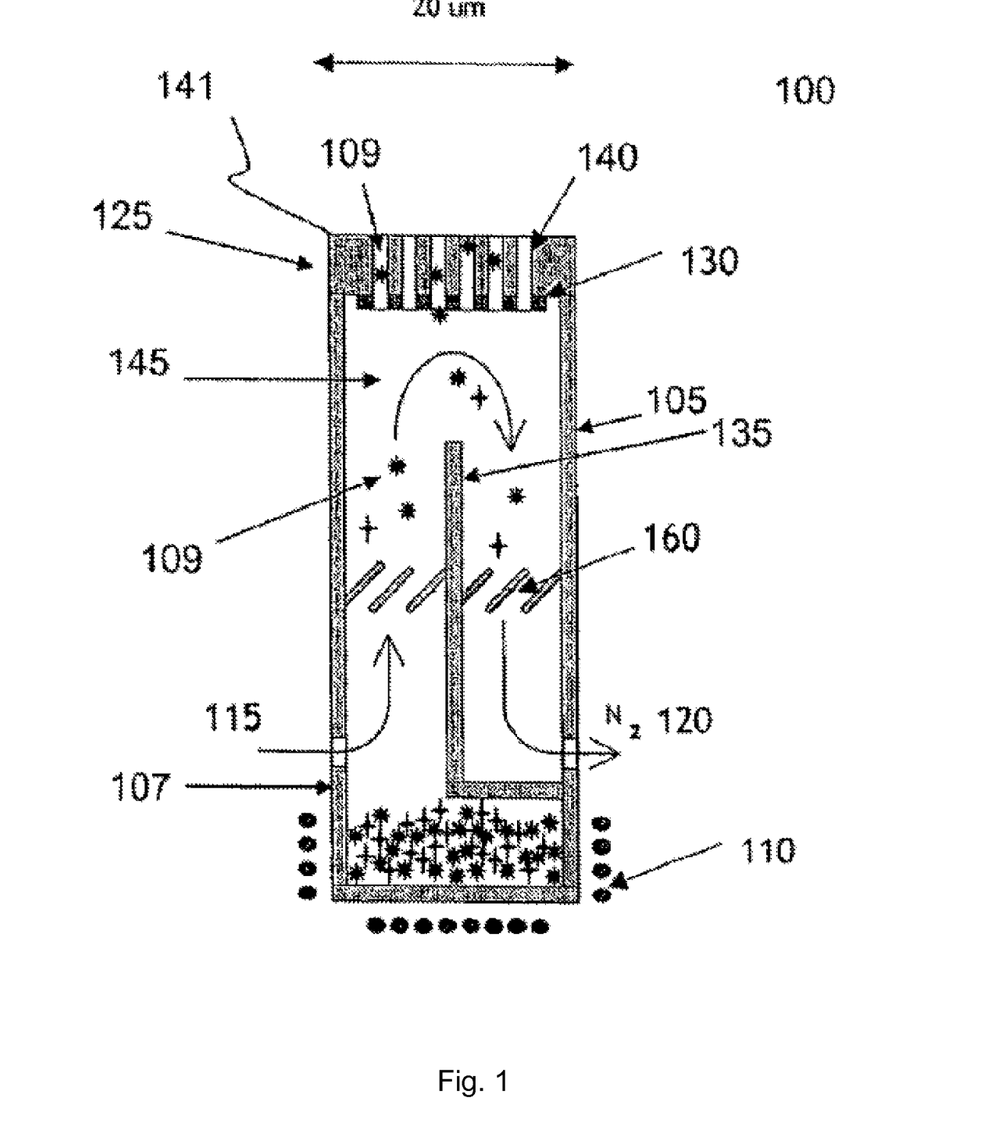
FIG. 1 is a schematic representation of a discharge apparatus for discharging organic compounds, or its mixture, according to one embodiment of the disclosure.
Figure 2:
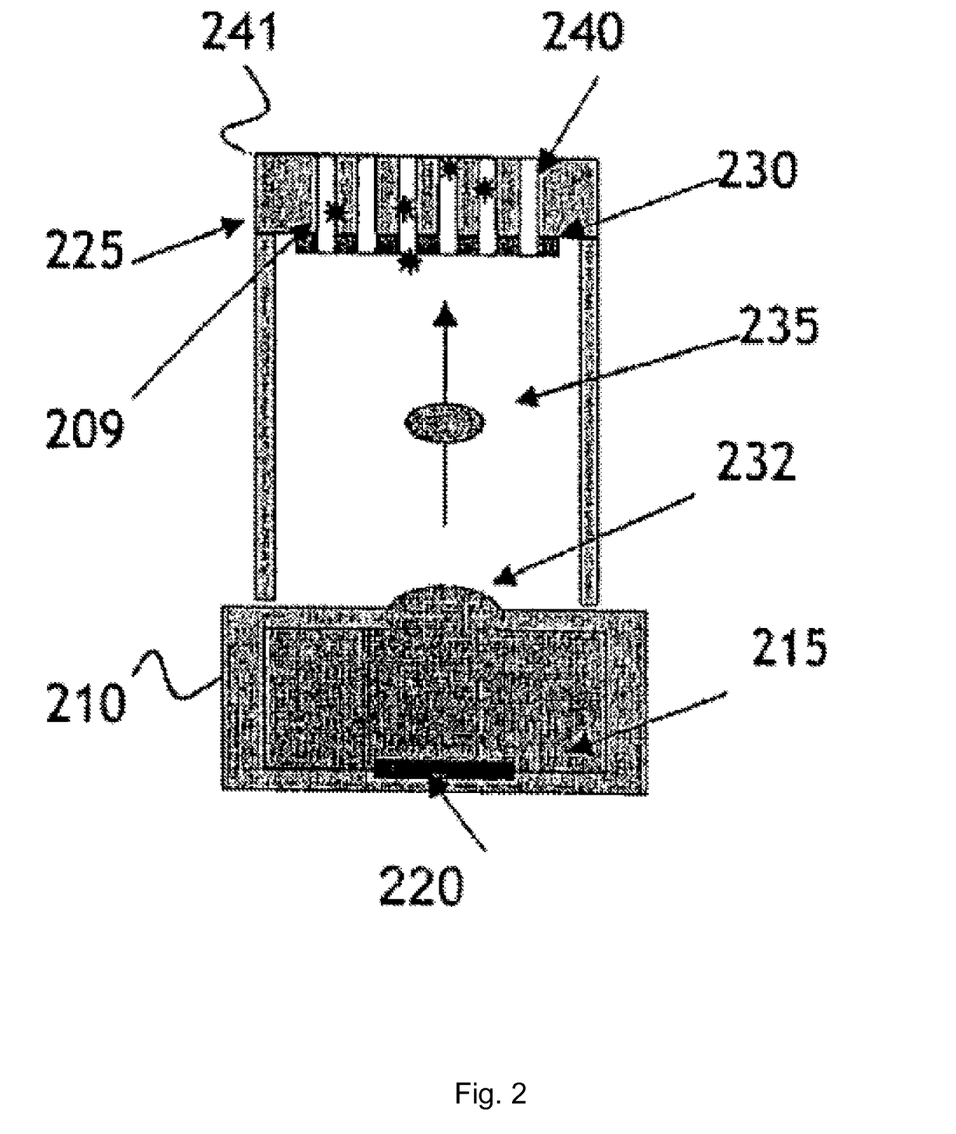
FIG. 2 is a schematic representation of a discharge apparatus for discharging organic compounds according to another embodiment of the disclosure.
Figure 3:
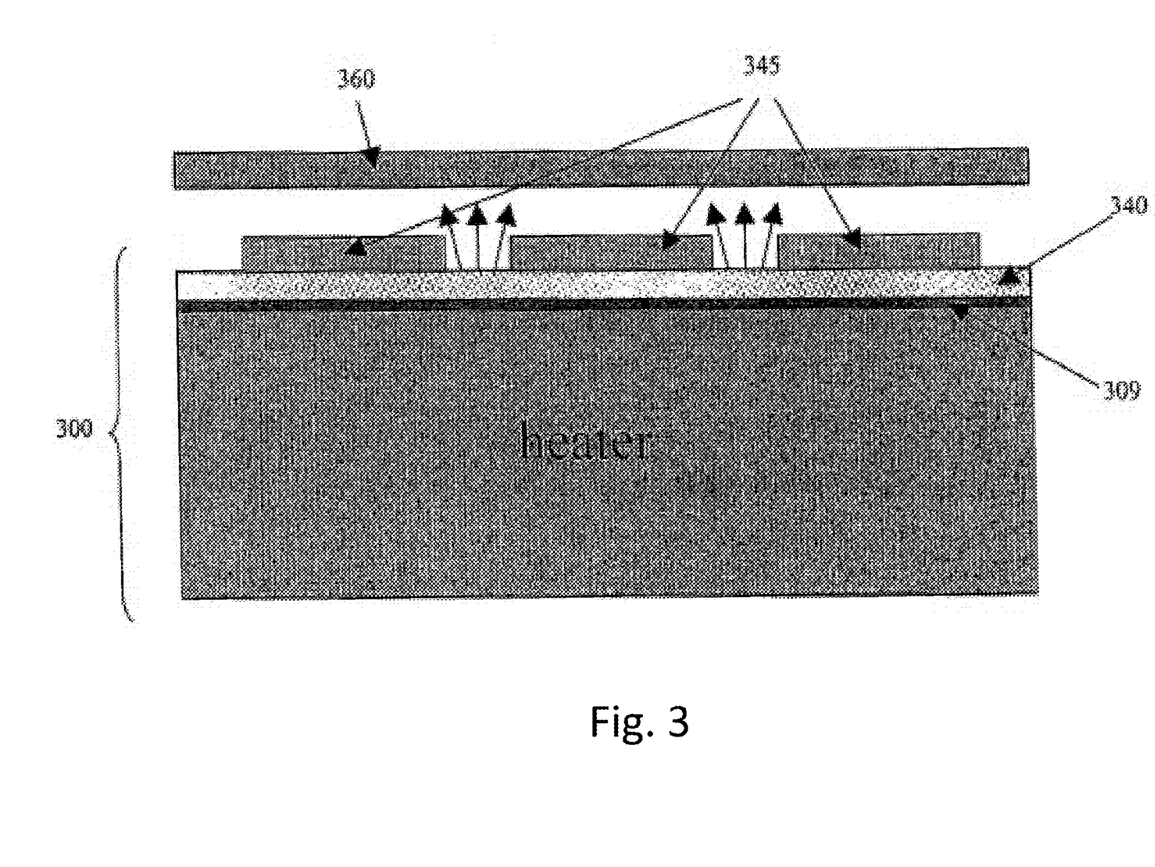
FIG. 3 schematically illustrates a discharge nozzle according to one embodiment of the disclosure.
Figure 4:
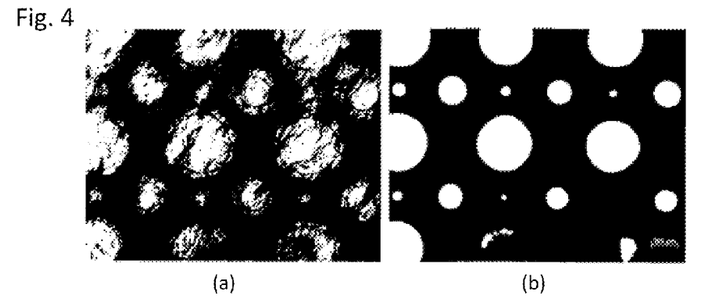
FIGS. 4A and 4B show an image printed according to one embodiment of the disclosure.
Figure 5:
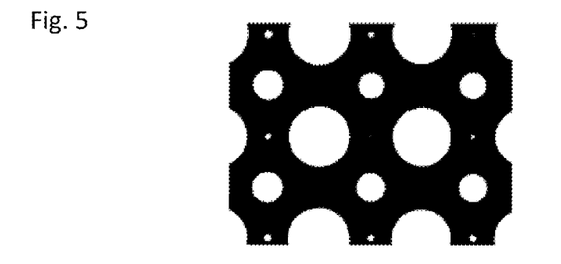
FIG. 5 is a photoluminescence image of a pattern printed by molecular jet printer system.
Figure 6:
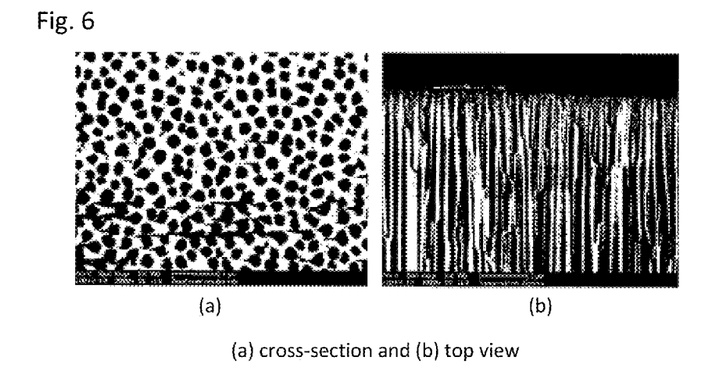
FIGS. 6A and 6B show the surface and the cross section, respectively, of a porous medium.

FIG. 1 is a schematic representation of a discharge apparatus for discharging organic compounds, or its mixture, according to one embodiment of the disclosure. Referring to FIG. 1, exemplary apparatus for deposing an organic material on a substrate includes housing 105 having discharge nozzle 125 at one end and a reservoir 107 at another end. Reservoir 107 may contain organic constituents required for forming an LED film. The organic constituent may be liquid or solid. Heat source 110 is provided to heat reservoir 107 and the content thereof. Heat source 110 can provide heating of about 100-700.degree. C.

Housing 105 may optionally include inlet 115 and outlet 120. The inlet and outlet can be defined by a flange adapted to receive a carrier gas (interchangeably, transport gas.) In one embodiment, the carrier gas is an inert gas such as nitrogen or argon. Delivery path 135 can be formed within housing 105 to guide the flow of the carrier gas. Thermal shields 160 may be positioned to deflect thermal radiation from heat source 110 to thereby protect discharge nozzle 125 and organic particles contained therein.

In the exemplary embodiment of FIG. 1, the discharge section includes discharge nozzle 125 and nozzle heater 130. Among others, the discharge nozzle can be formed from anodized porous aluminum oxide or porous silicon membranes or other solid membranes. Such material are capable of blocking organic material from escaping through the porous medium when the organic material is delivered onto the porous medium's surface. Discharge nozzle 125 includes rigid portions 141 separated by micro-pores 140. Micropores 140 block organic material from escaping through the medium until the medium is appropriately activated. Depending on the desired application, micro-pores 140 can provide conduits (or passages) in the order of micro- or nano-pores. In one embodiment, the pore size is in the range of about 5 nm-100 microns. In another embodiment pores are about 100 nm to about 10 microns. Nozzle heater 130 is positioned proximal to the discharge nozzle 125. When activated, nozzle heater 130 provides a pulse of energy, for example as heat, to discharge nozzle 125. The activation energy of the pulse dislodges organic material 109 contained within micro-pores 140.

Figure 7A:
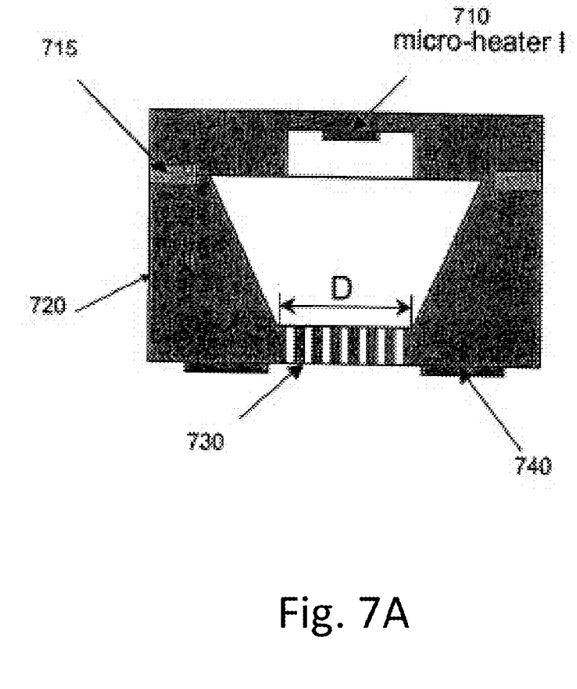
FIGS. 7A and 7B illustrate a molecular jet printing apparatus according one embodiment of the disclosure in cross-sectional and top views, respectively.
Figure 7B:
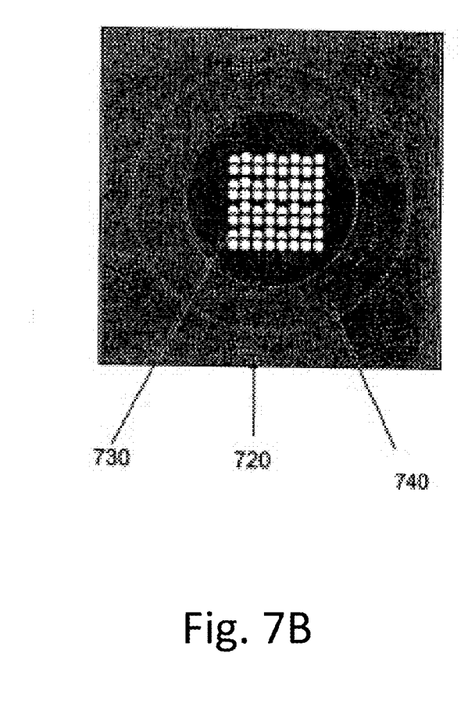

In a method according to one embodiment of the disclosure, reservoir 107 is commissioned with organic material suitable for LED deposition. The organic material may be in liquid or solid form. Source heater 110 provides heat adequate to evaporate the organic material and form suspended particles 109. By engaging a carrier gas inlet 115, suspended particles 109 are transported through thermal shields 160 toward discharge nozzle 125. The carrier gas is directed to gas outlet 120 through delivery path 135. Particles 109 reaching discharge nozzle are lodged in micro-pores 130. Activating nozzle heater 130 to provide energy to discharge nozzle 125 can cause ejection of organic particles 109 from the discharge nozzle. Nozzle heater 130 can provide energy in cyclical pulses. The intensity and the duration of each pulse can be defined by a controller (not shown.) The activating energy can be thermal energy. A substrate can be positioned immediately adjacent to discharge nozzle 125 to receive the ejected organic particles. Applicants have discovered that the exemplary embodiment shown in FIG. 1 can form a think organic film on a substrate with great accuracy. The embodiment of FIG. 1 is also advantageous in that it can substantially reduce substrate heating, minimizes local clogging and provide the most efficient use of organic material.

FIG. 2 is a schematic representation of a discharge apparatus for discharging organic compounds according to another embodiment of the disclosure. Referring to FIG. 2, apparatus 200 is adapted for forming an organic film substantially free from solvent. Apparatus 200 includes reservoir 210 for receiving organic solution 215. In one embodiment, organic solution 215 contains organic material dissolved in a solvent. Thermal resistor 220 is positioned proximal to reservoir 210 to heat organic solution 215. Orifice 232 separates reservoir 210 from discharge nozzle 225. Discharge nozzle 225 comprises micro-pores 240 separated by rigid sections 241.

Because of the size of orifice 232, surface tension of organic solution prevents discharge of organic solution 215 from the reservoir until appropriately activated. Once thermal resistor 220 is activated, energy in the form of heat causes evaporation of droplet 235 within a chamber of apparatus 200. Solvents have a lower vapor pressure and evaporate rapidly. Once evaporates, organic compound within droplet 235 is transported to discharge nozzle 225. Discharge nozzle 225 receives the organic material 209 within micro-pores 240. The solvent can be recycled back to organic solution 215 or can be removed from the chamber (not shown). By activating nozzle heater 230, micro-pores 240 dislodge organic particles 209, thereby forming a film on an immediately adjacent substrate (not shown.) In one embodiment, nozzle heater 230 can be activated in a pulse-like manner to provide heat to discharge nozzle cyclically.

FIG. 3 schematically illustrates a discharge nozzle according to one embodiment of the disclosure. In FIG. 3, discharge nozzle 300 comprises heater 330, porous medium 340 and integrated mask 345. Heater 330 is communicates pulse energy in the form of heat to organic material 309 causing dislodge thereof from porous medium 340. Integrated mask 345 effectively masks portions of the porous medium from transmitting organic ink material 309. Consequently, a film forming on substrate 360 will define a negative image of the integrated mask.

Thus, in one embodiment, the particles can be discharged from the porous medium by receiving thermal energy from a proximal resistive heater, or a thermal radiation heater, or by electrostatic force pull out of the micro-porous, or by mechanical vibration.

FIGS. 4A and 4B show an image printed according to one embodiment of the disclosure. Specifically, FIG. 4 shows the printing result using the exemplary apparatus shown in FIG. 3. The ink material is Alq3 and was pre-coated on the backside of an anodized porous alumina disc. FIG. 4A shows the LED organic printed pattern under halogen illumination. FIG. 4B shows the photoluminescence image under UV illumination.

FIG. 5 is a photoluminescence image of a pattern printed by molecular jet printer system according to another embodiment of the disclosure. FIG. 5 was obtained by using the discharge nozzle shown in FIG. 3. The ink material was Alq3. The ink material was drop cast on the backside of anodized porous alumina disc.

FIGS. 6A and 6B show the surface and the cross section, respectively, of a porous medium. The porous medium can be used according to the principles disclosed herein with a discharge nozzle or as a part of a nozzle having an integrated mask (see FIG. 3.) FIG. 6A shows the surface of the porous medium. FIG. 6B shows a cross-section of the porous medium. FIG. 6A shows a scale of 1 μm and FIG. 6B has a scale of 2 μm.

FIGS. 7A and 7B illustrate a molecular jet printing apparatus according to an embodiment of the disclosure in cross-sectional and top views, respectively. Referring to FIG. 7A, printing apparatus 700 includes micro-heater 710 which can be used as a liquid delivery system. Wafer bonding layer 715 connects the liquid delivery system to nozzle section 720. Porous openings 730 are positioned at a discharge end of nozzle 720 and micro-heaters 740 are positioned adjacent to porous openings 730 to providing energy required to eject organic material or ink from nozzle 720. FIG. 7B shows a top view of the nozzle shown in FIG. 7A including porous openings 730 and heaters 740.

While the principles of the disclosure have been illustrated in relation to the exemplary embodiments shown herein, the principles of the disclosure are not limited thereto and include any modification, variation or permutation thereof.

What is claimed is:

1. A method for depositing a layer of substantially solvent-free organic material on a substrate, comprising:
    heating the organic material to form a plurality of suspended organic particles;
    delivering the suspended organic particles to a discharge nozzle, the discharge nozzle having a plurality of micro-pores for receiving the suspended organic particles;
    processing the suspended organic particles through the plurality of micro-pores to substantially block a portion of the suspended organic particles; and
    energizing the discharge nozzle to pulsatingly eject the suspended organic particles from the plurality of micro-pores onto the substrate.

2. The method of claim further comprising positioning the discharge nozzle proximal to the substrate.

3. The method of claim 1, wherein the step of energizing the discharge nozzle further comprises heating the discharge nozzle.

4. The method of claim 1, wherein the step of delivering the suspended organic particles further comprises transporting the suspended organic particles with a carrier gas.

5. The method of claim 4, wherein the carrier gas is inert.

6. The method of claim 1, wherein the step of energizing the discharge nozzle further comprises mechanically vibrating the discharge nozzle.

7. The method of claim 1, wherein processing the suspended organic material further comprises processing the suspended organic material through micro-pores having a porous medium to separate a quantity of organic particles from a quantity of solvent.

8. The method of claim 1, wherein processing the suspended organic material further comprises separating an organic material from a solvent.

9. The method of claim 1, further comprising deflecting thermal radiation from the discharge nozzle.

10. A method for depositing substantially solvent-free organic film on a substrate, the method comprising:
    transporting an OLED solution from a reservoir to a discharge nozzle, the OLED solution having OLED particles in a solvent;
    receiving the OLED solution at a plurality of micro-pores of the discharge nozzle, each micro-pore containing a porous medium;
    separating a quantity of OLED particles from the solvent at the porous medium of the micro-pores;
    removing the solvent from the discharge nozzle; and
    dislodging the quantity of organic particles from the discharge nozzle onto a substrate.

11. The method of claim 10, wherein transporting an OLED solution from a reservoir to a discharge nozzle further comprises heating the OLED solution.

12. The method of claim 10, wherein the OLED solution comprises a quantity of OLED particles dissolved in solvent.

13. The method of claim 10, further comprising heating the discharge nozzle to dislodge the quantity of organic particles.

* * * * *